United States Patent
Tsai et al.

(10) Patent No.: US 8,575,970 B2
(45) Date of Patent: Nov. 5, 2013

(54) TRACK AND HOLD CIRCUIT AND RELATED RECEIVING DEVICE WITH TRACK AND HOLD CIRCUIT EMPLOYED THEREIN

(75) Inventors: Hung-Chieh Tsai, Tainan County (TW); Yu-Hsin Lin, Taipei (TW); Chi-Lun Lo, Taoyuan County (TW); Jong-Woei Chen, Hsinchu (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 112 days.

(21) Appl. No.: 12/695,164

(22) Filed: Jan. 28, 2010

(65) Prior Publication Data

US 2011/0181334 A1    Jul. 28, 2011

(51) Int. Cl.
*H03K 17/00* (2006.01)

(52) U.S. Cl.
USPC ................................. 327/94; 327/91; 327/96

(58) Field of Classification Search
USPC ............................................. 327/91, 94, 96
See application file for complete search history.

(56) References Cited

U.S. PATENT DOCUMENTS

| | | | | |
|---|---|---|---|---|
| 5,479,121 A * | 12/1995 | Shen et al. | | 327/94 |
| 5,999,052 A * | 12/1999 | Tang | | 330/254 |
| 6,144,234 A * | 11/2000 | Nakamura | | 327/94 |
| 6,226,322 B1 * | 5/2001 | Mukherjee | | 375/229 |
| 6,492,876 B1 * | 12/2002 | Kamal et al. | | 330/304 |
| 7,057,451 B2 * | 6/2006 | Lou et al. | | 327/553 |
| 7,209,007 B1 * | 4/2007 | Kamal et al. | | 330/304 |
| 7,542,508 B2 * | 6/2009 | Marlett et al. | | 375/233 |
| 2003/0058048 A1 * | 3/2003 | Ueno et al. | | 330/254 |
| 2005/0191981 A1 * | 9/2005 | Kahl et al. | | 455/250.1 |
| 2007/0176682 A1 * | 8/2007 | Nakamura et al. | | 330/278 |
| 2009/0245420 A1 * | 10/2009 | Hausmann et al. | | 375/298 |

\* cited by examiner

*Primary Examiner* — Ryan Jager
(74) *Attorney, Agent, or Firm* — Winston Hsu; Scott Margo

(57) ABSTRACT

An operational circuit includes: a gain control circuit arranged to provide a gain value upon an input signal according to a set of control signals, wherein the gain control circuit includes a first resistor-based network and a second resistor-based network; an operational amplifier coupled to the gain control circuit and arranged to generate an output signal according to the input signal and the gain value; and a first capacitor coupled to the operational amplifier and arranged to hold the output signal between a first input terminal and a first output terminal of the operational amplifier, wherein when the operational circuit is operating, a first terminal of the first capacitor is consistently coupled to the first input terminal of the operational amplifier, and a second terminal of the first capacitor is consistently coupled to the first output terminal of the operational amplifier.

20 Claims, 3 Drawing Sheets

TRACK AND HOLD CIRCUIT AND RELATED RECEIVING DEVICE WITH TRACK AND HOLD CIRCUIT EMPLOYED THEREIN

BACKGROUND

The present invention relates to a track and hold circuit, and a related receiving device with the track and hold circuit employed therein, and more particularly to an arrangement for improving problems of kick-back noise and signal distortion in a track and hold circuit, and a related receiving device.

In a wireless receiving system, a track and hold circuit is utilized to track a down converted intermediate frequency signal and maintain the value of the track signal for a predetermined time interval. Then, an analog-to-digital converter (ADC) converts the track signal into a corresponding digital signal. The corresponding digital signal is provided to determine if the voltage level of blocker signal received by the wireless receiving system is within a predetermined range. If the digital signal indicates that the voltage level of the received blocker exceeds the predetermined voltage range, an adjusting mechanism is employed to adjust the gain of a front-end stage and/or a back-end stage of the wireless receiving system in order to receive the RF signal precisely. However, since the track and hold operation of the track and hold circuit is accomplished by controlling a plurality of switches in the track and hold circuit, the charge injection generated by the plurality of switches may result in a kick-back noise to the front-end stage and the back-end stage of the wireless receiving system when the track and hold circuit tracks and holds the down converted intermediate frequency signal, consequently affecting the signal-to-noise ratio and distortion ratio of a base-band signal generated by the back-end stage. In addition, the charge injection generated by the plurality of switches may introduce some distortion upon the track signal and the corresponding digital signal, which in turn affects the receiving capability of the wireless receiving system. Therefore, providing a clean and low distortion track and hold circuit in the wireless receiving system is desirable.

SUMMARY

According to a first embodiment of the present invention, a track and hold circuit is disclosed. The track and hold circuit comprises a gain control circuit, an operational amplifier, and a first capacitor. The gain control circuit is arranged to provide a gain value upon an input signal according to a set of control signals, the gain control circuit comprises: a first resistor-based network arranged to selectively provide a first resistance between a first signal receiving terminal receiving the input signal and the first input terminal of the operational amplifier according to the set of control signals; and a second resistor-based network arranged to selectively provide a second resistance between the first input terminal of the operational amplifier and the first output terminal of the operational amplifier according to the set of control signals. The operational amplifier is arranged to generate an output signal according to the input signal and the gain value. The first capacitor is arranged to hold the output signal between a first input terminal and a first output terminal of the operational amplifier. When the track and hold circuit is operating, a first terminal of the first capacitor is consistently coupled to the first input terminal of the operational amplifier, and a second terminal of the first capacitor is consistently coupled to the first output terminal of the operational amplifier.

According to a second embodiment of the present invention, a track and hold circuit is disclosed. The track and hold circuit comprises a gain control circuit, an operational amplifier, and a first capacitor. The gain control circuit is arranged to provide a gain value upon an input signal according to a set of control signals. The operational amplifier is arranged to generate an output signal according to the input signal and the gain value. The first capacitor is arranged to hold the output signal between a first input terminal and a first output terminal of the operational amplifier, wherein there is no switching element connected to the first capacitor in series between the first input terminal and the first output terminal of the operational amplifier, and the gain control circuit selectively provides a first resistance between a first signal receiving terminal receiving the input signal and the first input terminal of the operational amplifier, and selectively provides a second resistance between the first input terminal of the operational amplifier and the first output terminal of the operational amplifier according to the set of control signals.

According to a third embodiment of the present invention, a receiving device is disclosed. A receiving device comprises a front end circuit, a back end circuit, a track and hold circuit. The front end circuit is arranged to receive a first signal and generate a second signal according to the first signal, wherein a frequency of the first signal is different from a frequency of the second signal. The back end circuit is coupled to the front end circuit, for processing the second signal. The track and hold circuit is coupled to the front end circuit, and comprises a gain control circuit, an operational amplifier, and a capacitor. The gain control circuit is arranged to provide a gain value upon the second signal according to a set of control signals, and the gain control circuit comprises: a first resistor-based network arranged to selectively provide a first resistance between a first signal receiving terminal receiving the input signal and the first input terminal of the operational amplifier according to the set of control signals; and a second resistor-based network arranged to selectively provide a second resistance between the first input terminal of the operational amplifier and the first output terminal of the operational amplifier according to the set of control signals. The operational amplifier is coupled to the gain control circuit and arranged to generate an output signal according to the second signal and the gain value. The capacitor is coupled to the operational amplifier and arranged to hold the output signal between an input terminal and an output terminal of the operational amplifier. When the track and hold circuit is operating, a first terminal of the capacitor is consistently coupled to the input terminal of the operational amplifier, and a second terminal of the capacitor is consistently coupled to the output terminal of the operational amplifier.

According to a fourth embodiment of the present invention, a receiving device is disclosed. A receiving device comprises a front end circuit, a back end circuit, a track and hold circuit. The front end circuit is arranged to receive a first signal and generate a second signal according to the first signal, wherein a frequency of the first signal is different from a frequency of the second signal. The back end circuit is coupled to the front end circuit, for processing the second signal. The track and hold circuit is coupled to the front end circuit, and the track and hold circuit comprises: a gain control circuit arranged to provide a gain value upon the second signal according to a set of control signals; an operational amplifier coupled to the gain control circuit and arranged to generate an output signal according to the second signal and the gain value; and a capacitor coupled to the operational amplifier and arranged to hold the output signal between an input terminal and an output terminal of the operational amplifier. Furthermore, there is no switching element connected to the capacitor in series between the input terminal and the output terminal of the operational amplifier, and the gain control circuit selectively provides a first resistance between a first signal receiving terminal receiving the second signal and the first input terminal of the operational amplifier, and selectively provides a second resistance between the first input terminal of the operational amplifier and the first output terminal of the operational amplifier according to the set of control signals.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
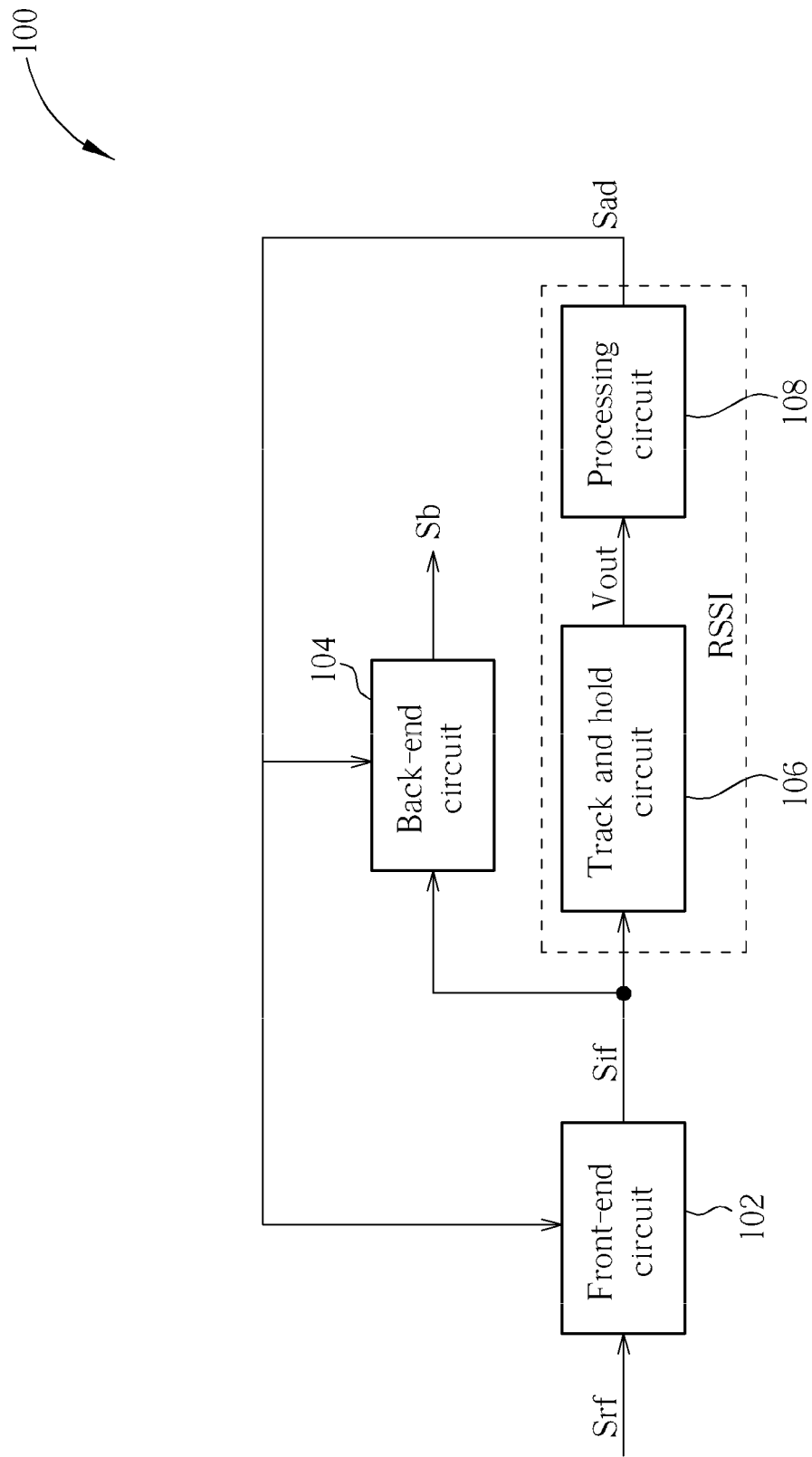
FIG. 1 is a diagram illustrating a receiving circuit of a wireless system according to an embodiment of the present invention.

FIG. 1 is a diagram illustrating a receiving circuit 100 of a wireless system according to an embodiment of the present invention. The receiving circuit 100 comprises a front-end circuit 102, a back-end circuit 104, a track and hold circuit 106, and a processing circuit 108. The front-end circuit 102 may be an RF (Radio Frequency) front-end circuit and the back-end circuit 104 may be an IF (Intermediate Frequency) module. The front-end circuit 102 is arranged to receive an RF signal Srf and down convert the RF signal Srf to generate an IF signal Sif, thus a frequency of the IF signal Sif is slower than a frequency of the RF signal Srf. The back end circuit 104 is coupled to the front-end circuit 102 for processing the IF signal Sif to generate a baseband signal Sb. The track and hold circuit 106 and the processing circuit 108 are arranged to be a receive signal strength indicator (RSSI). The track and hold circuit 106 is coupled to the front-end circuit 102 for tracking the IF signal Sif and maintaining the voltage level of the IF signal Sif for a predetermined time interval. The processing circuit 108 is coupled to the track and hold circuit 106 for processing the voltage level of the IF signal Sif to determine if the voltage level of the IF signal Sif down converted by the receiving circuit 100 is within a predetermined voltage range. If the voltage level of the IF signal Sif is determined to exceed the predetermined voltage range, the processing circuit 108 generates an adjusting signal Sad to adjust the gain of the front-end circuit 102 or/and the back-end circuit 104 such that the receiving circuit receives the RF signal Srf precisely. By an appropriate feedback control, the baseband signal Sb can be controlled within the full scale range of the backend ADC and be digitized without any information distortion for digital processing. Therefore, the processing circuit 108 may comprise at least an analog-to-digital converter (ADC) for converting the voltage level of the IF signal Sif into a corresponding digital signal, wherein the digital signal is utilized to generate the adjusting signal Sad.

Figure 2A:
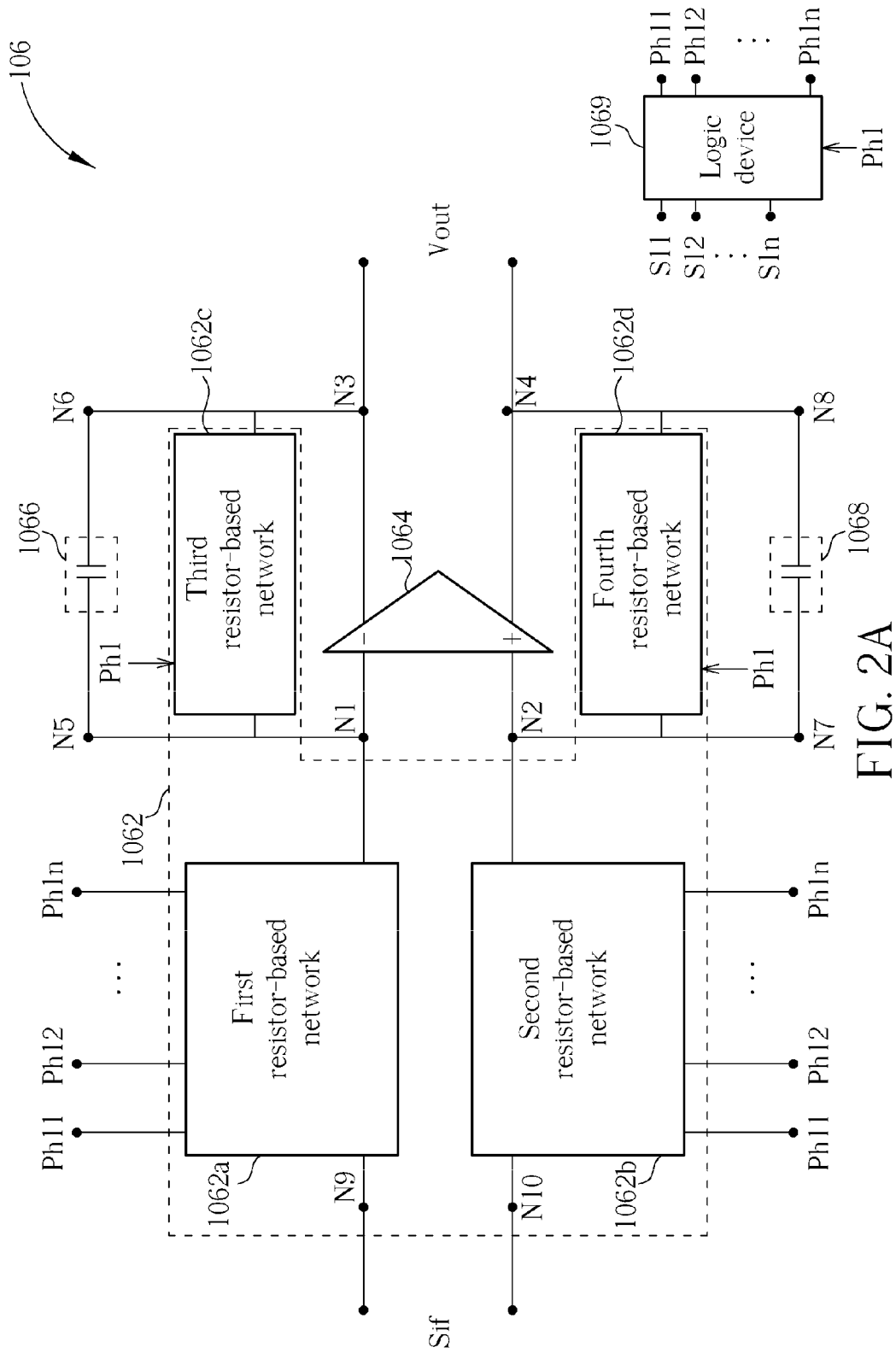
FIG. 2A is a diagram illustrating a track and hold circuit according to a first embodiment of the present invention.

The track and hold circuit 106 comprises a gain control circuit 1062, an operational amplifier 1064, a first capacitor 1066, and a second capacitor 1068 as shown in FIG. 2A. FIG. 2A is a diagram illustrating the track and hold circuit 106 according to an embodiment of the present invention. The gain control circuit 1062 is arranged to provide a gain value upon the IF signal Sif according to a set of control signals S11, S12, . . . , S1n, and Ph1. The operational amplifier 1064 is coupled to the gain control circuit 1062 and arranged to generate the output voltage signal Vout according to the IF signal Sif and the gain value provided by the gain control circuit 1062, wherein the output voltage signal Vout corresponds to the voltage level of the IF signal Sif tracked by the track and hold circuit 106. The first capacitor 1066 and the second capacitor 1068 are coupled to the operational amplifier 1064 and arranged to hold the output voltage signal Vout between a first and a second input terminal N1, N2, and a first and a second output terminal N3, N4 of the operational amplifier 1064. Please note that, when the track and hold circuit 106 is operating, a first terminal N5 of the first capacitor 1066 is consistently coupled to the first input terminal N1 of the operational amplifier 1064, a second terminal N6 of the first capacitor 1066 is consistently coupled to the first output terminal N3 of the operational amplifier 1064, a first terminal N7 of the second capacitor 1068 is consistently coupled to the second input terminal N2 of the operational amplifier 1064, and a second terminal N8 of the second capacitor 1068 is consistently coupled to the second output terminal N4 of the operational amplifier 1064. In other words, there is no switching element, such as a switch, connected to the first capacitor 1066 in series between the first input terminal N1 and the first output terminal N3 of the operational amplifier 1064, and no switching element connected to the second capacitor 1068 in series between the second input terminal N2 and the second output terminal N4 of the operational amplifier 1064.

The gain control circuit 1062 comprises a first resistor-based network 1062a, a second resistor-based network 1062b, a third resistor-based network 1062c, and a fourth resistor-based network 1062d. The first resistor-based network 1062a is arranged to selectively provide a first resistance between a first signal receiving terminal N9 receiving the IF signal Sif and the first input terminal N1 of the operational amplifier 1604 according to the set of control signals S11, S12, . . . , S1n, and Ph1. The second resistor-based network 1062b is arranged to selectively provide a second resistance between a second signal receiving terminal N10 receiving the IF signal Sif and the second input terminal N2 of the operational amplifier 1604 according to the set of control signals S11, S12, . . . , S1n, and Ph1. The third resistor-based network 1062c is arranged to selectively provide a third resistance between the first input terminal N1 of the operational amplifier 1064 and the first output terminal N3 of the operational amplifier 1064 according to the set of control signals S11, S12, . . . , S1n, and Ph1. The fourth resistor-based network 1062d is arranged to selectively provide a fourth resistance between the second input terminal N2 of the operational amplifier 1064 and the second output terminal N4 of the operational amplifier 1064 according to the set of control signals S11, S12, . . . , S1n, and Ph1.

Figure 2B:
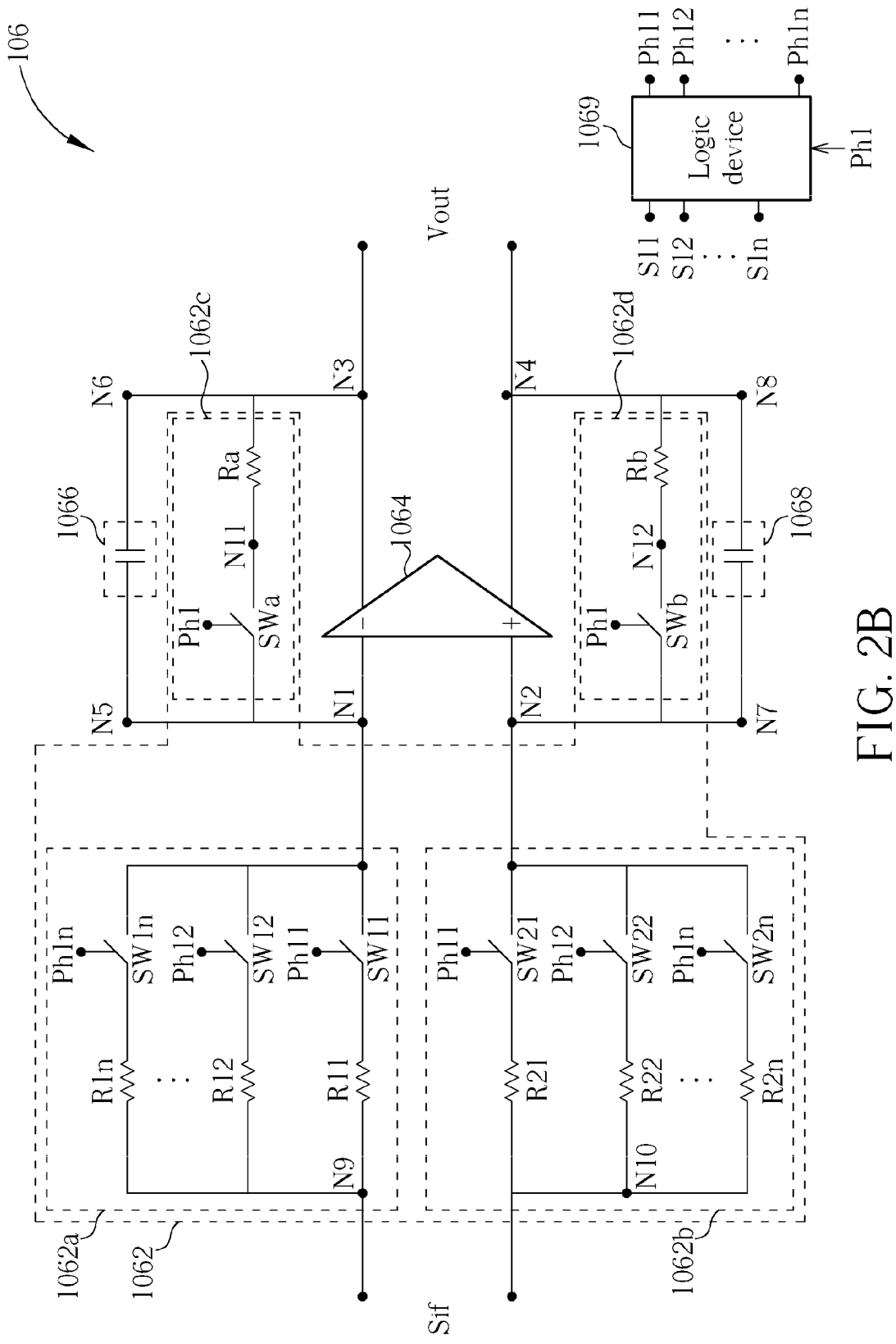
FIG. 2B is a detailed diagram illustrating the track and hold circuit in FIG. 2A.

FIG. 2B is a detailed diagram illustrating the track and hold circuit 106 according to one embodiment of the present invention, wherein a logic device 1069 is further included in FIG. 2B. The logic device 1069 is coupled to the first resistor-based network 1062a, the second resistor-based network 1062b, the third resistor-based network 1062c, and the fourth resistor-based network 1062d. The logic device 1069 is arranged to receive the set of control signals S11, S12, . . . , S1n, and Ph1, and generate a set of synchronized control signals Ph11, Ph12, . . . , Ph1n according to a specific control signal (i.e., Ph1) of the set of control signals S11, S12, . . . , S1n, and Ph1.

According to FIG. 2B, the first resistor-based network 1062a comprises a plurality of first resistors R11, R12, . . . , R1n, each having a first terminal coupled to the first signal receiving terminal N9, and a plurality of first switches SW11, SW12, . . . , SW1n, coupled to the first resistors R11, R12, . . . , R1n, respectively, wherein each of the first switches SW11, SW12, . . . , SW1n has a first terminal coupled to a second terminal of a corresponding first resistor, and a second terminal coupled to the first input terminal N1 of the operational amplifier 1064, and each of the first switches SW11, SW12, . . . , SW1n selectively couples the second terminal of the corresponding first resistor to the first input terminal N1 of the operational amplifier 1064 according to the set of synchronized control signals Ph11, Ph12, . . . , Ph1n. Similarly, the second resistor-based network 1062b comprises a plurality of second resistors R21, R22, . . . , R2n, each having a first terminal coupled to the second signal receiving terminal N10, and a plurality of second switches SW21, SW22, . . . , SW2n, coupled to the second resistors R21, R22, . . . , R2n, respectively, wherein each of the second switches SW21, SW22, . . . , SW2n has a first terminal coupled to a second terminal of a corresponding first resistor, and a second terminal coupled to the second input terminal N2 of the operational amplifier 1064, and each of the second switches SW21, SW22, . . . , SW2n selectively couples the second terminal of the corresponding second resistor to the second input terminal N2 of the operational amplifier 1064 according to the set of synchronized control signals Ph11, Ph12, . . . , Ph1n.

In addition, the third resistor-based network 1062c comprises a switch SWa having a first terminal coupled to the first input terminal N1 of the operational amplifier 1064, and a resistor Ra having a first terminal N11 coupled to a second terminal of the switch SWa, and a second terminal coupled to the first output terminal N3 of the operational amplifier 1064. The fourth resistor-based network 1062d comprises a switch SWb having a first terminal coupled to the second input terminal N2 of the operational amplifier 1064, and a resistor Rb having a first terminal N12 coupled to a second terminal of the switch SWb, and a second terminal coupled to the second output terminal N4 of the operational amplifier 1064. The switch SWa selectively couples the first input terminal N1 of the operational amplifier 1064 to the first terminal N11 of the resistor Ra according to the specific control signal Ph1. The switch SWb selectively couples the second input terminal N2 of the operational amplifier 1064 to the first terminal N12 of the resistor Rb according to the specific control signal Ph1.

Please note that the track and hold circuit 106 in FIG. 2A and FIG. 2B is a differential track and hold circuit, thus the IF signal Sif and the RF signal Srf are differential signals, and the first capacitor 1066, the first resistor-based network 1062a, the second resistor-based network 1062b are substantially the same as the second capacitor 1068, the third resistor-based network 1062c, the fourth resistor-based network 1062d, respectively. In addition, the first input terminal N1 and the second input terminal N2 are in virtual ground when the track and hold circuit 106 is operating. Those skilled in this art will understand that the single end version of the track and hold circuit 106 also belongs to the scope of the present invention.

When the track and hold circuit 106 is operating and is tracking the IF signal Sif, the set of synchronized control signals Ph11, Ph12, . . . , Ph1n switch on the same set of the first switches SW11, SW12, . . . , SW1n and the specific control signal Ph1' switches on the second switches SW21, SW22, . . . , SW2n, and the switches SWa, SWb concurrently. Then, the electric charge that corresponds to the IF signal Sif is accumulated in the first capacitor 1066 and the second capacitor 1068. When the set of synchronized control signals Ph11, Ph12, . . . , Ph1n switch off the first switches SW11, SW12, . . . , SW1n, the second switches SW21, SW22, . . . , SW2n, and the switches SWa, SWb concurrently, the accumulated electric charge that corresponds to the IF signal Sif is held in the first capacitor 1066 and the second capacitor 1068, and the track and hold circuit 106 generates the output voltage signal Vout across the first output terminal N3 and the second output terminal N4. Therefore, the gain value provided by the gain control circuit 1062 is determined by the set of synchronized control signals Ph11, Ph12, . . . , Ph1n.

Since the first resistors R11, R12, . . . , R1n are employed between the first signal receiving terminal N9 and the first switches SW11, SW12, . . . , SW1n, and the second resistors R21, R22, . . . , R2n are employed between the second signal receiving terminal N10 and the second switches SW21, SW22, . . . , SW2n, the charge injections generated by the first switches SW11, SW12, . . . , SW1n and the second switches SW21, SW22, . . . , SW2n may be isolated by the first resistors R11, R12, . . . , R1n and the second resistors R21, R22, . . . , R2n, respectively. Therefore, the kick-back noise of the track and hold circuit 106 is suppressed. Furthermore, since the second terminals of the first switches SW11, SW12, . . . , SW1n and the second switches SW21, SW22, . . . , SW2n and the first terminals of the switches SWa, SWb are coupled to the virtual ground terminals, i.e., the first input terminal N1 and the second input terminal N2, of the operational amplifier 1064, respectively, the charge injections generated by the first switches SW11, SW12, . . . , SW1n, the second switches SW21, SW22, . . . , SW2n, and the switches SWa, SWb are conducted to virtual ground when the sampled signals (i.e., the electric charge that corresponds to the IF signal Sif) are held in the first capacitor 1066 and the second capacitor 1068. Therefore, the distortion problem that emerges in the related art is greatly improved by the arrangement set in the track and hold circuit 106.

Briefly, the track and hold circuits 106 improves the distortion problem caused by the charge injection generated from the switching element and thereby generate the output voltage signal (i.e., Vout) more precisely. The track and hold circuits 106 further eliminates the kick-back noise of the receiving circuit 100 and thereby improves the signal-to-noise ratio of the baseband signal Sb generated by the back end circuit 104.

Those skilled in the art will readily observe that numerous modifications and alterations of the device and method may be made while retaining the teachings of the invention.

What is claimed is:
1. A track and hold circuit, comprising:
a gain control circuit, arranged to provide a gain value upon an input signal according to a set of first signals, the gain control circuit comprises:
a first resistor-based network, arranged to selectively provide a first resistance between a first signal receiv- ing terminal receiving the input signal and a first input terminal of an operational amplifier according to the set of first signals; and a second resistor-based network, arranged to selectively provide a second resistance between the first input terminal of the operational amplifier and a first output terminal of the operational amplifier according to the set of first signals;

the operational amplifier, arranged to generate an output signal according to the input signal and the gain value; and a first capacitor, arranged to hold the output signal between the first input terminal and the first output terminal of the operational amplifier;

wherein when the track and hold circuit is operating, a first terminal of the first capacitor is consistently coupled to the first input terminal of the operational amplifier, and a second terminal of the first capacitor is consistently coupled to the first output terminal of the operational amplifier; and the first resistor-based network and the second resistor-based network are driven by a set of second signals when the track and hold circuit is operating, and the set of second signals are synchronized according to a specific signal of the set of first signals.

2. The track and hold circuit of claim 1, wherein there is no switching element connected to the first capacitor in series between the first input terminal and the first output terminal of the operational amplifier.

3. The track and hold circuit of claim 1, wherein:
the first resistor-based network comprises:
a plurality of first resistors, each having a first terminal coupled to the first signal receiving terminal; and
a plurality of first switches, coupled to the first resistors, respectively, wherein each of the first switches has a first terminal coupled to a second terminal of a corresponding first resistor, and a second terminal coupled to the first input terminal of the operational amplifier; and each of the first switches selectively couples the second terminal of the corresponding first resistor to the first input terminal of the operational amplifier according to the set of first signals; and
the second resistor-based network comprises:
a second switch, having a first terminal coupled to the first input terminal of the operational amplifier; and
a second resistor, having a first terminal coupled to a second terminal of the second switch, and a second terminal coupled to the first output terminal of the operational amplifier; and the second switch selectively couples the first input terminal of the operational amplifier to the first terminal of the second resistor according to the set of first signals.

4. The track and hold circuit of claim 3, further comprising:
a logic device, coupled to the first resistor-based network and the second resistor-based network;
wherein the logic device is arranged to receive the set of first signals and generate a set of second signals according to a specific signal of the set of first signals; each of the first switches selectively couples the second terminal of the corresponding first resistor to the first input terminal of the operational amplifier according to the set of second signals; and the second switch selectively couples the first input terminal of the operational amplifier to the first terminal of the second resistor according to the specific signal.

5. The track and hold circuit of claim 3, wherein when at least one of the first switches is switched on and the second switch is switched on, the track and hold circuit tracks the input signal, and when none of the first switches is switched on and the second switch is switched off, the track and hold circuit holds the output signal by the first capacitor.

6. The track and hold circuit of claim 3, wherein the first input terminal of the operational amplifier is directly connected between the first terminals of each of the first switches and the second switch.

7. The track and hold circuit of claim 1, further comprising:
a second capacitor, arranged to hold the output signal between a second input terminal and a second output terminal of the operational amplifier;
wherein when the track and hold circuit is operating, a first terminal of the second capacitor is consistently coupled to the second input terminal of the operational amplifier, and a second terminal of the second capacitor is consistently coupled to the second output terminal of the operational amplifier.

8. The track and hold circuit of claim 7, wherein there is no switching element connected to the second capacitor in series between the second input terminal and the second output terminal of the operational amplifier.

9. The receiving device of claim 1, wherein the track and hold further comprises:
a second capacitor, arranged to hold the output signal between a second input terminal and a second output terminal of the operational amplifier;
wherein when the track and hold circuit is operating, a first terminal of the second capacitor is consistently coupled to the second input terminal of the operational amplifier, and a second terminal of the second capacitor is consistently coupled to the second output terminal of the operational amplifier.

10. The receiving device of claim 9, wherein there is no switching element connected to the second capacitor in series between the second input terminal and the second output terminal of the operational amplifier.

11. A receiving device, comprising:
a front end circuit, arranged to receive a first signal and generate a second signal according to the first signal, wherein a frequency of the first signal is different from a frequency of the second signal;
a back end circuit, coupled to the front end circuit, for processing the second signal; and
a track and hold circuit, coupled to the front end circuit, comprising:
a gain control circuit, arranged to provide a gain value upon the second signal according to a set of control signals, the gain control circuit comprises:
a first resistor-based network, arranged to selectively provide a first resistance between a first signal receiving terminal receiving the input signal and a first input terminal of an operational amplifier according to the set of control signals; and
a second resistor-based network, arranged to selectively provide a second resistance between the first input terminal of the operational amplifier and a first output terminal of the operational amplifier according to the set of control signals;
the operational amplifier, arranged to generate an output signal according to the second signal and the gain value; and
a capacitor, arranged to hold the output signal between the first input terminal and the first output terminal of the operational amplifier;
wherein when the track and hold circuit is operating, a first terminal of the capacitor is consistently coupled to the first input terminal of the operational amplifier, and a second terminal of the capacitor is consistently coupled to the first output terminal of the operational amplifier; and when the first resistance is not provided between the first signal receiving terminal and the first input terminal, and the second resistance is not provided between the first input terminal and the first output terminal, the track and hold circuit holds the output signal by the first capacitor.

12. The receiving device of claim 11, wherein there is no switching element connected to the first capacitor in series between the first input terminal and the first output terminal of the operational amplifier.

13. The receiving device of claim 11, wherein:
the first resistor-based network comprises:
   a plurality of first resistors, each having a first terminal coupled to the first signal receiving terminal; and
   a plurality of first switches, coupled to the first resistors, respectively, wherein each of the first switches has a first terminal coupled to a second terminal of a corresponding first resistor, and a second terminal coupled to the first input terminal of the operational amplifier; and each of the first switches selectively couples the second terminal of the corresponding first resistor to the first input terminal of the operational amplifier according to the set of control signals; and
the second resistor-based network comprises:
   a second switch, having a first terminal coupled to the first input terminal of the operational amplifier; and
   a second resistor, having a first terminal coupled to a second terminal of the second switch, and a second terminal coupled to the first output terminal of the operational amplifier; and the second switch selectively couples the first input terminal of the operational amplifier to the first terminal of the second resistor according to the set of control signals.

14. The receiving device of claim 13, wherein the track and hold circuit further comprises:
a logic device, coupled to the first resistor-based network and the second resistor-based network;
wherein the logic device is arranged to receive the set of control signals and generate a set of synchronized control signals according to a specific control signal of the set of control signals; each of the first switches selectively couples the second terminal of the corresponding first resistor to the first input terminal of the operational amplifier according to the set of synchronized control signals; and the second switch selectively couples the first input terminal of the operational amplifier to the first terminal of the second resistor according to the specific control signal.

15. The receiving device of claim 13, wherein when at least one of the first switches is switched on and the second switch is switched on, the track and hold circuit tracks the input signal, and when none of the first switches is switched on and the second switch is switched off, the track and hold circuit holds the output signal by the first capacitor.

16. The receiving device of claim 13, wherein the first input terminal of the operational amplifier directly connected between the first terminals of each of the first switches and the second switch.

17. The receiving device of claim 11, wherein the first resistor-based network and the second resistor-based network are drove by a plurality of clock signals when the track and hold circuit is operating.

18. A receiving device, comprising:
a front end circuit, arranged to receive a first signal and generate a second signal according to the first signal, wherein a frequency of the first signal is different from a frequency of the second signal;
a back end circuit, coupled to the front end circuit, for processing the second signal; and
a track and hold circuit, coupled to the front end circuit, comprising:
   a gain control circuit, arranged to provide a gain value upon the second signal according to a set of control signals;
   an operational amplifier, arranged to generate an output signal according to the second signal and the gain value; and
   a capacitor, arranged to hold the output signal between a first input terminal and a first output terminal of the operational amplifier;
wherein there is no switching element connected to the capacitor in series between the first input terminal and the first output terminal of the operational amplifier, and the gain control circuit selectively provides a first resistance between a first signal receiving terminal receiving the second signal and the first input terminal of the operational amplifier, and selectively provides a second resistance between the first input terminal of the operational amplifier and the first output terminal of the operational amplifier according to the set of control signals; and when the first resistance is not provided between the first signal receiving terminal and the first input terminal, and the second resistance is not provided between the first input terminal and the first output terminal, the track and hold circuit holds the output signal by the first capacitor.

19. The receiving device of claim 18, wherein when the first resistance is provided between the first signal receiving terminal and the first input terminal of the operational amplifier, and the second resistance is provided between the first input terminal of the operational amplifier and the first output terminal of the operational amplifier, the track and hold circuit tracks the input signal.

20. The receiving device of claim 18, wherein the track and hold circuit comprises:
a second capacitor, arranged to hold the output signal between a second input terminal and a second output terminal of the operational amplifier;
wherein there is no switching element connected to the second capacitor in series between the second input terminal and the second output terminal of the operational amplifier.

* * * * *